(12) United States Patent
Lander

(10) Patent No.: US 8,179,201 B2
(45) Date of Patent: May 15, 2012

(54) RESONATOR

(75) Inventor: Robert James Pascoe Lander, Leuven (BE)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 12/892,672

(22) Filed: Sep. 28, 2010

(65) Prior Publication Data
US 2011/0080224 A1 Apr. 7, 2011

(30) Foreign Application Priority Data
Sep. 28, 2009 (EP) .................................... 09252287

(51) Int. Cl.
- H03B 5/30 (2006.01)
- H03L 1/00 (2006.01)
- H01P 1/30 (2006.01)

(52) U.S. Cl. .......... 331/154; 331/66; 331/176; 333/229; 333/234

(58) Field of Classification Search .................. 331/65, 331/66, 96, 154, 156, 176; 333/219, 219.1, 333/227, 229, 234
See application file for complete search history.

(56) References Cited

U.S. PATENT DOCUMENTS

| | | | |
|---|---|---|---|
| 6,557,419 B1 | 5/2003 | Herb et al. | |
| 6,958,566 B2 * | 10/2005 | Nguyen et al. | 310/321 |
| 6,987,432 B2 * | 1/2006 | Lutz et al. | 333/186 |
| 7,211,926 B2 * | 5/2007 | Quevy et al. | 310/315 |
| 7,443,258 B2 * | 10/2008 | Hagelin | 331/156 |
| 7,514,853 B1 | 4/2009 | Howe et al. | |
| 7,843,283 B2 * | 11/2010 | Reichenbach et al. | 333/186 |
| 2006/0261703 A1 | 11/2006 | Quevy et al. | |

FOREIGN PATENT DOCUMENTS

| | | |
|---|---|---|
| EP | 1548935 A1 | 6/2005 |
| WO | 2004/095696 A2 | 11/2004 |

OTHER PUBLICATIONS

Wan-Thai Hsu, et al. : 'Mechanically Temperature-Compensated Flexural-Mode Micromechanical Resonators,' Technical Digest, IEEE, pp. 399-402, (Dec. 2000).

* cited by examiner

Primary Examiner — Levi Gannon

(57) ABSTRACT

A resonator having an effective spring constant ($k_z$) and comprising a beam having a beam spring constant ($k_B$) adapted to resonate in an oscillation direction, and extending at a non-zero angle ($\theta$) to the oscillation direction, wherein the resonator has a predetermined geometry and is formed from one or more materials, the or each material having a coefficient of thermal expansion (CTE), the CTE of the or each material together with the predetermined geometry of the resonator causing $\theta$ to vary with temperature, such that the temperature dependence of the beam spring constant is compensated for, resulting in the effective spring constant of the resonator remaining substantially constant within an operating temperature range.

12 Claims, 4 Drawing Sheets

RESONATOR

This application claims the priority of European patent application no. 09252287.9, filed on Sep. 28, 2009, the contents of which are incorporated by reference herein in their entirety.

BACKGROUND OF THE INVENTION

Micromechanical systems are devices formed from small components configured on a substrate for example, a silicon substrate.

A MEMS resonator comprises a beam (or spring) structure supported by one or more supports which supports are connected to, or formed integrally with the substrate. MEMS resonators may be used, for example, as parts of clocks or as signal filtering circuits.

A problem with MEMS resonators is that the oscillation frequency of the resonator varies with the ambient temperature and with the materials and processes used to form the resonator.

The main cause of the temperature dependence of the resonance frequency is the temperature coefficient of the elastic (Young's) modulus. Usually a MEMS resonator will be formed from a material having a negative temperature coefficient of the elastic modulus of that material. This means that the spring constant of the resonator will be reduced at high temperatures which in turn results in a reduced oscillation frequency.

Known techniques for attempting to correct the temperature dependence of the oscillation frequency maybe classified as either active or passive temperature compensation techniques.

Known active temperature compensation techniques include temperature measurement followed by bias voltage correction, phase-locked loop (PPL) control feedback, and the heating of resonator springs to a predetermined temperature. A problem with such active temperature compensation techniques is that they suffer from large power dissipation. Additionally in the case of phase-locked loop control feedback, there is an unacceptable phase noise produced.

A known passive compensation technique involves depositing a coating of one or more layers onto the beam of a MEMS resonator. Each of the one or more layers has a different temperature coefficient of the respective elastic modulus to that of the beam. When, as is usually the case, the beam is formed from a material having a negative temperature coefficient of the elastic modulus, then the one or more materials which are deposited or coated onto the beam are chosen because they each have a positive temperature coefficient of the respective elastic modulus. This means that any expansion or contraction of the beam may be compensated for by contraction or expansion of the one or more other materials.

International patent application No. WO 2004/095696 describes a flexural resonator beam in which different materials are used to compensate for the coefficient of thermal expansion. The resonator disclosed in WO 2004/095696 relies on tensional forces in order to compensate for the temperature dependence of the resonant frequency.

A problem with these known passive techniques is that the formation processes such as deposition and oxidation that are used to coat the beam with one or more materials are not well enough controlled to deliver the required accuracy of thickness of coating. In addition, the spring constant is extremely sensitive to the width of the beam which also makes it typically very difficult to obtain accuracy.

BRIEF DESCRIPTION OF THE DRAWINGS

The invention will now be further described by way of example only with reference to the accompanying drawings in which.

DETAILED DESCRIPTION

Figure 1:
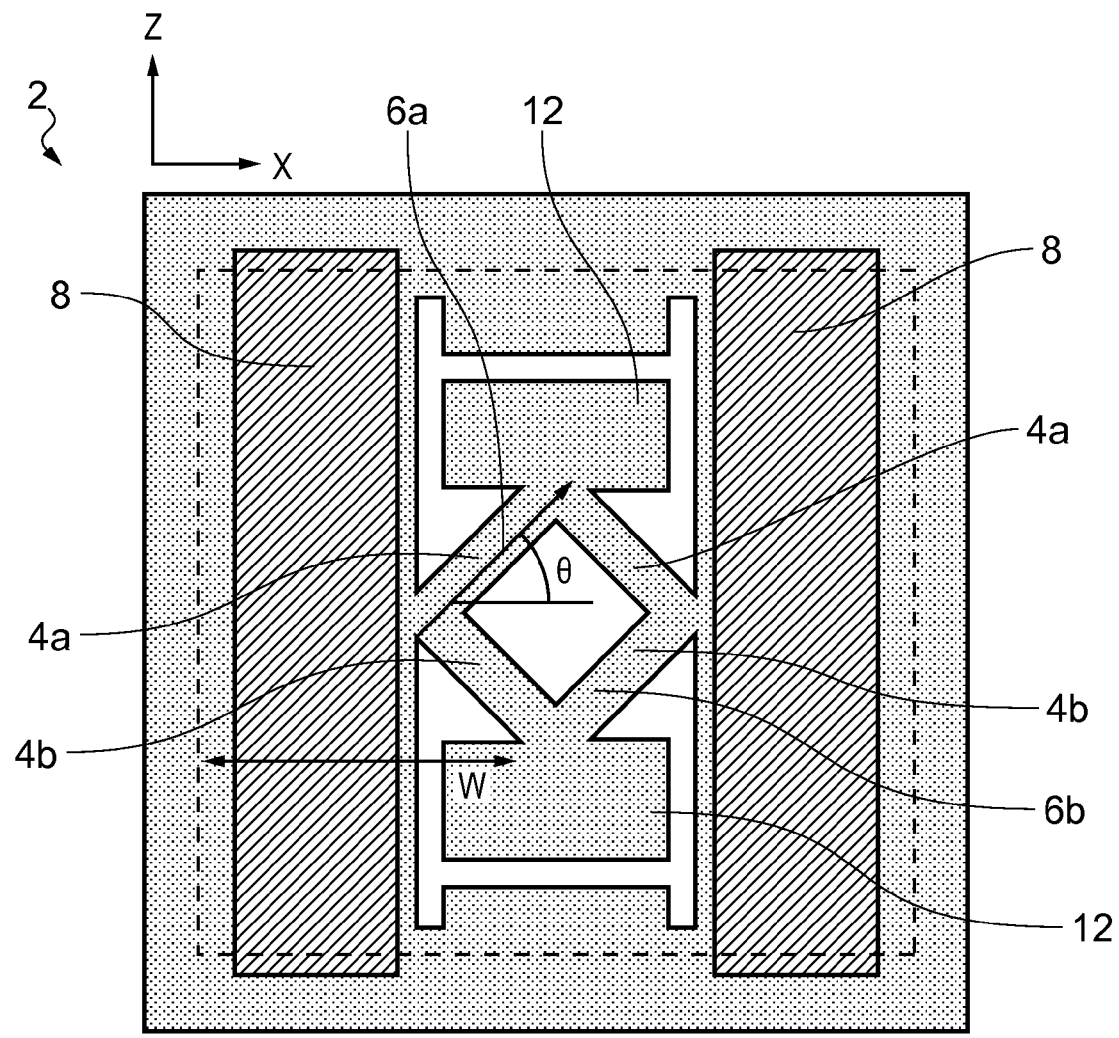
FIG. 1 is a schematic plan view of a micromechanical resonator according to the present invention.

In accordance with the invention there is provided a resonator having an effective spring constant and comprising a beam having a beam spring constant adapted to resonate in an oscillation direction, and extending at a non-zero angle ($\theta$) to the oscillation direction, wherein the resonator has a predetermined geometry and is formed from one or more materials, the or each material having a coefficient of thermal expansion (CTE), the CTE of the or each material together with the predetermined geometry of the resonator causing $\theta$ to vary with temperature, such that the temperature dependence of the beam spring constant is compensated for, resulting in the effective spring constant of the resonator remaining substantially constant within an operating temperature range.

The effective spring constant of a resonator remains substantially constant within an operating temperature range of the resonator. The resonant frequency of the resonator depends on the extent to which the oscillator (the beam) will stretch when a particular force is applied to it, or by it (see equation 2 below). The extent that an oscillator will stretch is directly dependent on the spring constant of the oscillator. In turn, the resonant frequency of an oscillator is a function of the extent to which an oscillator will stretch. This means that there is a relationship between the resonant frequency of the resonator and the spring constant of the resonator. More particularly, the resonant frequency (F) is proportional to the square root of the spring constant (k) divided by the mass (m) of the resonator (F~√(k/m)). Thus by ensuring that the effective spring constant of the resonator remains substantially constant, the resonant frequency of the resonator will be substantially independent of temperature within the operating temperature of the resonator.

By means of the present invention, the temperature dependence of the spring constant (and therefore the elastic modulus) of the material forming the beam of the resonator is compensated for, by forming the beam and other components of the resonator from a material or materials having thermal expansion coefficients that cause the geometry of the resonator to change with temperature to an extent that substantially compensates for the change in k with temperature such that the resonator frequency is substantially independent of the temperature.

This is achieved without having to coat the beam with layers of material that have a temperature coefficient of Young's modulus of opposite sign to that of the material from which the beam is formed, or without having to introduce a static strain into the beam.

The resonator may comprise a micromechanical resonator in which at least parts of the resonator such as the beam are formed from silicon. By forming the resonator at least in part from silicon, it is possible to use CMOS fabricating techniques to incorporate the resonator into integrated circuit for example.

In such embodiments, parts of the resonator may be formed from a silicon substrate. In particular, the parts of the resonator may be integrally formed in a silicon substrate.

The resonator may further comprise a support supporting the beam. The resonator may further comprise a cavity defined below the beam. The cavity enables the beam to flex into the cavity when resonating. The support, and cavity of the resonator enable the beam to flex freely in a resonance mode.

The resonator according to an embodiment in accordance with the invention may comprise more than one beam. In such an embodiment, the spring constant of each beam will be compensated for resulting in the effective spring constant of the resonator remaining substantially constant within the operating temperature range.

A resonator according to embodiments in accordance with the invention may comprise more than one support. The resonator may also comprise more than cavity.

The resonator may further comprise a mass attached to, or formed integrally with the beam. The resonator may comprise more than one mass.

The support is distinct from the beam that it supports because it does not move in response to any vibration motion of the mass.

The term "below" is not meant to imply any particular orientation of the resonator.

In accordance with the invention there is provided a method for tuning a resonator, the resonator having an effective spring constant and comprising a beam having a beam spring constant adapted to resonate in an oscillation direction, and extending at a non-zero angle (θ) to the oscillation direction, wherein the resonator has a predetermined geometry and is formed from one or more materials, the or each material having a coefficient of thermal expansion (CTE), the CTE of the or each material together with the predetermined geometry of the resonator causing θ to vary with temperature, such that the temperature dependence of the beam spring constant is compensated for, the method comprising the step of altering the geometry of the resonator whereby the effective spring constant of the resonator will remain substantially constant within an operating temperature range.

The method may comprise the step of forming the resonator from a silicon substrate.

The resonator may comprise one or more supports supporting the beam, and the step of altering the geometry of the resonator may comprise the step of adjusting the dimensions of the support, for example, the lateral dimensions of the support.

The magnitude of θ, the angle of the beam relative to the oscillation direction will depend on the geometry of the resonator, and the material or materials from which the resonator has been manufactured. The magnitude of θ may fall within the range 10° to 60°, preferably 10° to 45°, more preferably 10° to 30°. In one embodiment of the invention, the beam and the support are both formed from pure silicon. The support may have any particular length but in one embodiment the support length may be 10 times the length of the beam and θ may be substantially 28°.

In another embodiment in accordance with the invention, the support is formed from $Ni_3Si$ and has a length that is 10 times the length of the beam and θ is substantially 60°.

For a simple spring-mass resonator geometry, the effective spring constant of the resonator in the oscillation direction (the z direction) is denoted by the symbol $k_z$, and the spring constant of the beam is denoted by $k_B$.

For a free-free beam, $k_z = k_B \sin^2\theta$.  (1)

This relationship assumes that the torsional forces are negligible compared to the forces due to linear expansion or compression of the beam.

Since the spring constant of the beam will vary with temperature, by forming the resonator, from a material or materials having an appropriate coefficient of thermal expansion (CTE), a change in dimensions of the beam caused by a change in the operating temperature can be tuned so that the effective spring constant $k_z$ remains constant within the temperature range. In other words, by choosing an appropriate geometry and appropriate materials, the change in dimensions of the beam caused by the change in temperature can be tuned so that the change in θ caused by the expansion or contract of the beam compensates for the change in the spring constant of the particular component so that the effective spring constant of the resonator of a whole remains constant as the temperature varies.

Referring to FIG. 1 a MEMS resonator according to an embodiment of the invention is designated by the reference numeral 2. In this embodiment of the invention the resonator comprises four beams 4. A first pair of beams 4a forms a first spring 6a, and a second pair of beams 4b forms a second spring 6b. The beams 4a, 4b are supported by supports 8. The resonator further comprises masses 12 attached to, or formed integrally with one or more beams.

The resonator further comprises a cavity 10 (not shown in FIG. 1) and a mass 12.

In other embodiments of the invention there may be a different numbers of beams. In the description set out below, only one of the beams 4 will be considered in detail.

The masses 12 are attached only to the beams 4, and are otherwise freestanding.

The resonator is formed from a suitable material such as monocrystalline silicon, silicon dioxide in combination with Si, etc. in a known manner by etching a substrate such that the beam and spring are suspended over the substrate and are supported by the support beam 8 over a cavity.

As can be seen from FIG. 1, each beam 4 is arranged to lie at an angle of θ to the oscillation direction which is indicated by the arrow z.

In the embodiment illustrated, the materials used to form the components of the resonator 2 each have a negative temperature coefficient of the elastic modulus. This means that the spring constant of a particular component is reduced at higher temperatures resulting in a lower resonant frequency of oscillation.

The spring constant of an oscillator (k) determines the extent that the oscillator will stretch when a particular force (F) is applied to it or by it and is given by equation:

$$F = -kx \text{ (Hooke's Law)}. \quad (2)$$

From equation 1 it can be seen that if the dimensions and geometry of the resonator are such that the expansion of the beam causes θ to vary to such an extent that the variation in θ compensates for the change in spring constant with temperature, then the effective spring constant of the resonator will remain constant over a given temperature range. This will result in the resonant frequency of the resonator 2 remaining substantially constant with temperature.

The temperature dependence of the effective spring constant $k_z$ is defined by Equation 3 below:

$$\frac{dk_z}{dT} = \frac{dk_B}{dT}(\sin^2 v) + k_B \frac{d(\sin^2 v)}{dT} \quad (3)$$

When the increase in θ cancels out the decrease in $k_B$ then $$\frac{dk_z}{dT}$$

will equal 0. This in turn means that:

$$\frac{1}{k_B}\frac{dk_B}{dT} = \frac{1}{Y}\frac{dY}{dT} = -\frac{1}{(\sin^2 v)}\frac{d(\sin^2 v)}{dT} \quad (4)$$

Where Y is Young's modulus of the beam.

The right hand term of the above equation may be re-expressed in terms of the parameters W, $L_s$, $L_B$ and the linear thermal expansion coefficient of the cavity ($CTE_w$), support ($CTE_s$) and beam ($CTE_B$) which leads to the following relationship:

$$\alpha_B \equiv \frac{1}{k_B}\frac{dk_B}{dT} = 2(W - L_s)\frac{[W \cdot CTE_W - L_s \cdot CTE_S - (W - L_s) \cdot CTE_B]}{L_B^2 - (W - L_s)^2} \quad (5)$$

Where $\alpha_B$ is the thermal expansion coefficient of the beam, W is the width of the cavity, $L_s$ is the length of the beam 4, and $L_B$ is the length of the support 8. Further, $CTE_w$ is the coefficient of thermal expansion of the substrate, $CTE_s$ is the coefficient of thermal expansion of the support and $CTE_b$ is the coefficient of thermal expansion of the beam.

Three separate cases may now be considered. In each case, a particular component of the resonator according to an embodiment of the invention will be considered in isolation of the other components forming the resonator.

Beam Thermal Expansion Only

Figure 2:
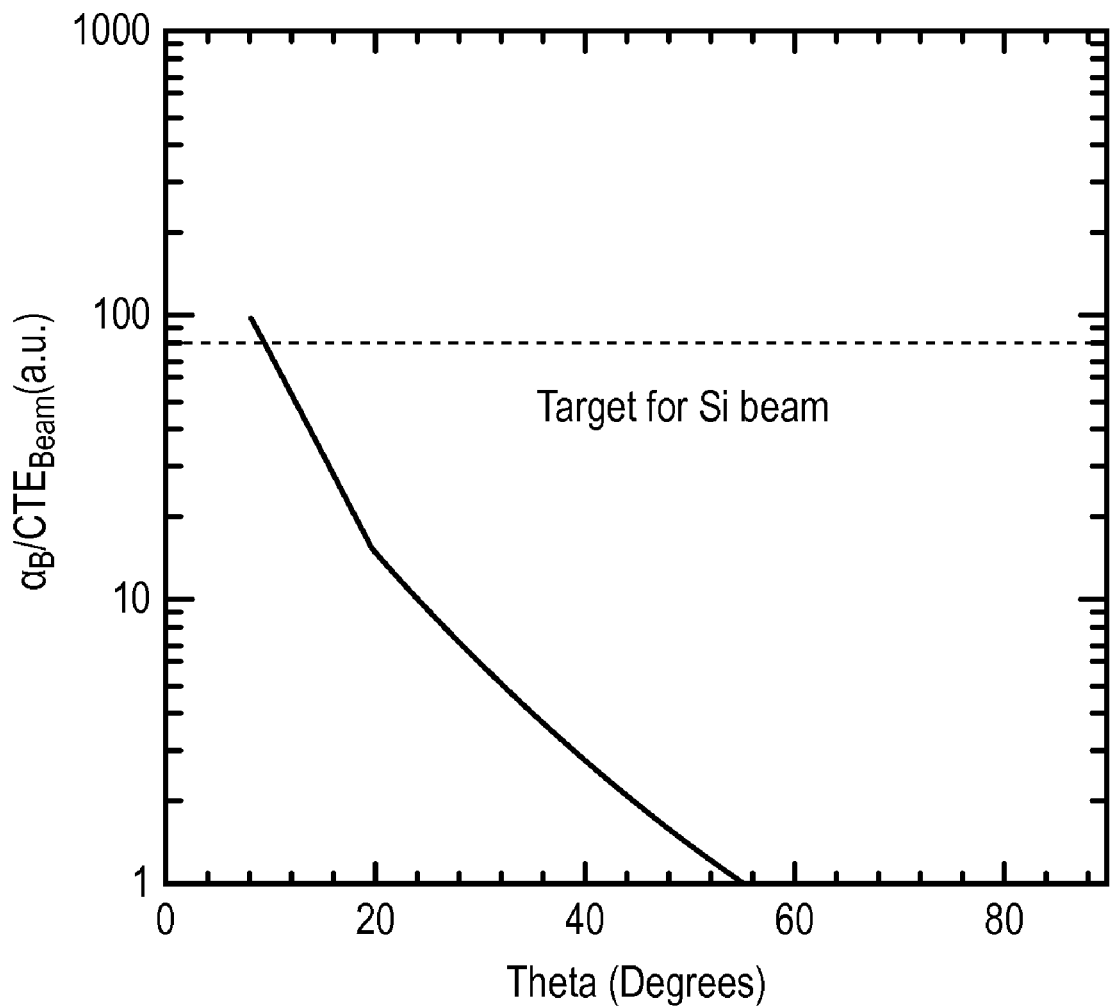
FIG. 2 is a graphical representation showing the magnitude of the angle of the beam ($\theta$) of the resonator of FIG. 1 relative to the direction of oscillation that is required to maintain a temperature independent spring constant $k_z$, as a function of the ratio of the temperature coefficient of the elastic modulus to $CTE_b$, with other expansion effects neglected.

In this case the relationship set out in equation 5 above can be reduced to:

$$\frac{\alpha_B}{CTE_B} = \frac{2}{\left(1 - \frac{L_B^2}{(W - L_s)^2}\right)} \quad (6)$$

where $CTE_B$ is the coefficient of thermal expansion of the beam material. The dependence of this ratio as a function of θ is shown in FIG. 2. From FIG. 2 the angle θ required to maintain the temperature independence of spring constant $k_z$ is shown as a function of the ratio of the $CTE_B$.

For a beam made of pure silicon the coefficient of thermal expansion of the beam will be $2.5^{e-6}$ deg$^{-1}$, and the thermal expansion coefficient to the beam $\alpha_B$ will be $2^{e-4}$ deg$^{-1}$.

As can be seen from FIG. 2 in the resonator shown in FIG. 1 it will be necessary for θ to be 10° in order that the temperature dependence of the elastic modulus is compensated for.

Support Thermal Expansion Only

Figure 3:
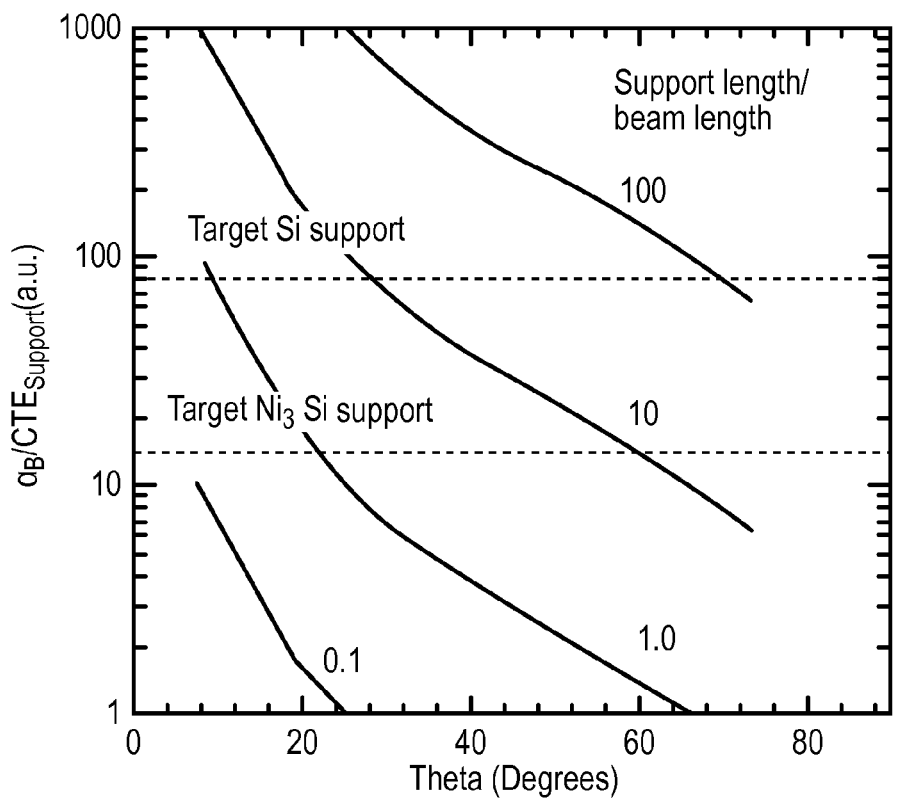
FIG. 3 is a graphical representation showing the magnitude of the angle $\theta$ that is required to maintain a temperature independent spring constant $k_z$ as a function of the ratio of the temperature coefficient of the elastic modulus to $CTE_s$ with other expansion effects being neglected, and the support length.

In this case the relation set out in equation 5 above can be reduced to:

$$\frac{\alpha_B}{CTE_s} = \frac{2(W - L_s)L_s}{(W - L_s)^2 - L_B^2}, \quad (7)$$

where $CTE_S$ is the coefficient of thermal expansion of the support material. The dependence of this ratio is a function of θ is shown in FIG. 3 for various support lengths which are expressed in units of beam length. Also shown in FIG. 3 is the ratio $\alpha_B/CTE_s$ for a support beam made from pure silicon and also for a support beam made from $Ni_3Si$. The coefficient of thermal expansion of $Ni_3Si$ is $15^{e-6}$ K$^{-1}$.

By increasing the length of the support beam, moderate beam angles of approximately 45° can be used. In addition, alternative materials such as metal silicides having higher thermal expansion coefficients can be incorporated into the support beam further relaxing the requirements on the angle θ of the beam.

When the support beam is formed from pure silicon, and the support beam is approximately 10 times the length of the beam, θ is required to be approximately 28°.

If the support beam is formed from $Ni_3Si$ and is 10 times the length of the beam, then θ is required to be 60° due to the larger CTE of $Ni_3Si$.

The support beam may be formed from $Ni_3Si$ by reacting silicon with nickel (Ni) in a controlled manner.

Cavity Thermal Expansion Only

Figure 4:
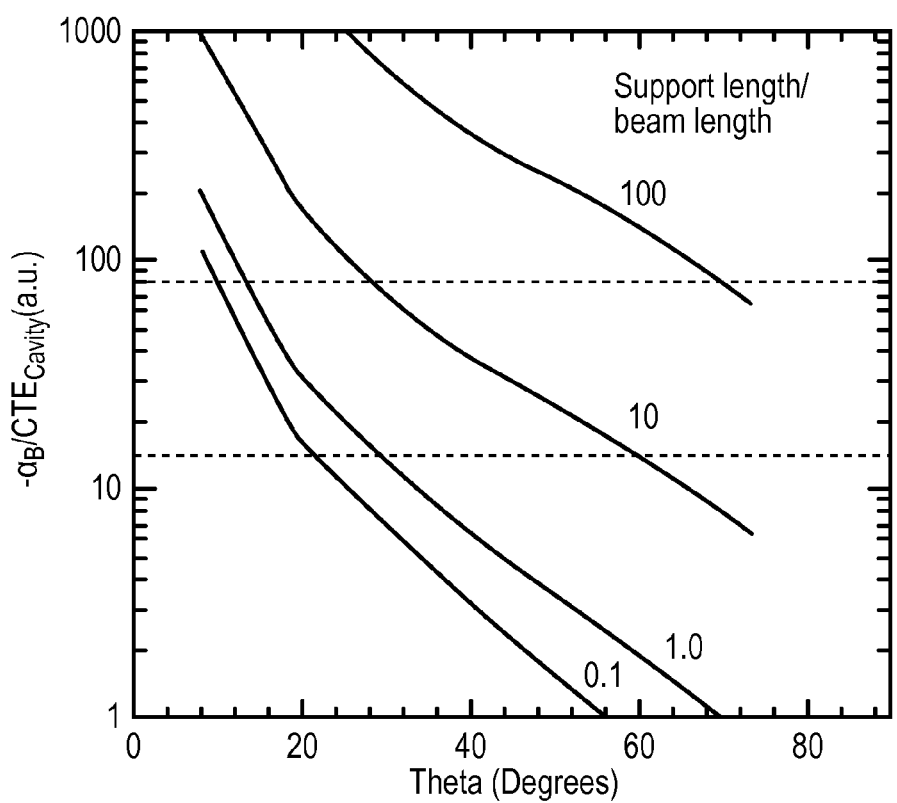
FIG. 4 is a graphical representation showing the angle of $\theta$ that is required to maintain the temperature independent spring constant $k_z$ as a function of the ratio of the temperature coefficient of the elastic modulus to $CTE_w$ with other expansion effects being neglected.

In this case the relation set out in equation 5 above can be reduced to:

$$\frac{\alpha_B}{CTE_W} = \frac{2(W - L_s)W}{L_B^2 - (W - L_s)^2}, \quad (8)$$

where $CTE_W$ is the coefficient of thermal expansion of the substrate/cavity material. The dependence of this ratio as a function of θ is shown in FIG. 4.

Cavity expansion enhances rather than cancels $\alpha_B$. For a resonator formed from pure silicon there is no geometrical change and thus cavity expansion perfectly cancels the effect of the beam and support expansion.

It can be seen from FIGS. 2 to 4 and the description set out hereinabove that the CTE of the beam or the support must be enhanced relative to the cavity in order to compensate for any temperature coefficient of the Young's modulus.

It is preferred to form the beam from monocrystalline silicon due to the mechanical properties of this material. The CTE of the cavity is defined by the substrate material which is usually monocrystalline silicon. This means that if the CTE of the support is adjusted, substantial tuning of the compensation effect shown in FIG. 3 can be achieved using well controlled process steps and without impacting on the mechanical properties of the materials in critical regions.

In each of the three cases described above it is assumed that only the beam or only the support or only the cavity respectively expand with temperature.

If all components expand at the same rate, as would be case if all components were formed from pure silicon system, then the geometry of the resonator will not change and the frequency will be purely dependent upon the Young's modulus.

In practice it is the differences in the CTE between, for example the support and cavity materials that change the overall geometry of the resonator.

An important feature of the present invention is that it is possible to tune the layout and material properties of the support in order to substantially perfectly compensate even if other expansion effects are included. For example the width, or the length, of the support may be altered in order to tune the resonator such that the effective spring constant of the resonator will remain substantially constant within a desired operating temperature range of the resonator.

Figure 5:
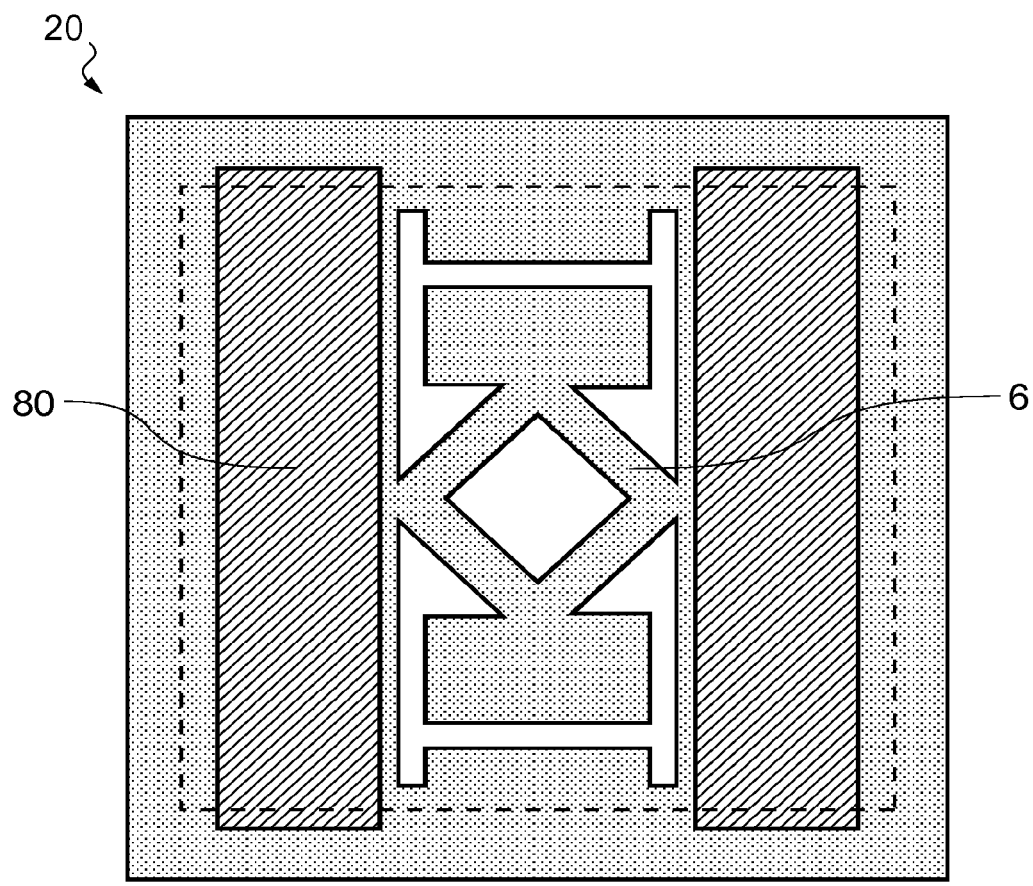
FIG. 5 is a schematic plan representation of a second embodiment of a resonator according to the present invention.
Figure 6:
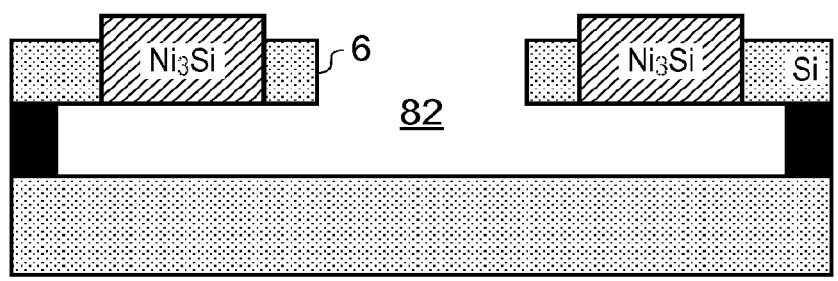
FIG. 6 is a cross-sectional representation of the resonator of FIG. 5.

Turning now to FIGS. 5 and 6, a second embodiment of the invention is shown. Parts of the resonator 20 that correspond to parts of the resonator 2 illustrated in FIG. 1 above have been given corresponding reference numerals for ease of reference.

The resonator 20 comprises supports 80 that support a beam 6. The supports 80 are formed from $Ni_3Si$. In other respects, the configuration of resonator 20 is similar to that of resonator 2 illustrated in FIG. 1. FIG. 6 shows the cavity 82 located beneath the beam 6.

The invention claimed is:

1. A resonator having an effective spring constant ($k_z$) and comprising:
   a beam, having a beam spring constant ($k_B$), adapted to resonate in an oscillation direction, and extending at a non-zero angle (θ) to the oscillation direction,
   wherein the resonator has a predetermined geometry and is formed from one or more materials, the or each material having a coefficient of thermal expansion (CTE), the CTE of the or each material together with the predetermined geometry of the resonator causing θ to vary with temperature, such that the temperature dependence of the beam spring constant is compensated for, resulting in the effective spring constant of the resonator remaining substantially constant within an operating temperature range.

2. A resonator according to claim 1 comprising a micromechanical resonator, wherein the beam is formed from silicon.

3. A resonator according to claim 1 wherein the resonator is integrally formed in a silicon substrate.

4. A resonator according to claim 1 further comprising a support supporting the beam, and a cavity defined below the beam.

5. A resonator according to claim 1 wherein θ falls within the range of 10° to 60°, preferably 10° to 45°, more preferably 10° to 30°.

6. A resonator according to claim 4 wherein the support has a length that is substantially 10 times the length of the beam and wherein θ is substantially 28°.

7. A resonator according to claim 4 wherein the support is formed from $Ni_3Si$.

8. A resonator according to claim 7 wherein the support has a length that is 10 times the length of the beam.

9. A method of tuning a resonator, the resonator having an effective spring constant ($k_z$) and comprising a beam having a beam spring constant ($k_B$) adapted to resonate in an oscillation direction, and extending at a non-zero angle (θ) to the oscillation direction, wherein the resonator has a predetermined geometry and is formed from one or more materials, the or each material having a coefficient of thermal expansion (CTE), the CTE of the or each material together with the predetermined geometry of the resonator causing θ to vary with temperature, such that the temperature dependence of the beam spring constant is compensated for, the method comprising the step of altering the geometry of the resonator whereby the effective spring constant of the resonator will remain substantially constant within an operating temperature range.

10. A method according to claim 9 comprising the step of forming the resonator from a silicon substrate.

11. A method according to claim 9 wherein the resonator comprises a support supporting the beam, and the step of altering the geometry of the resonator comprises the step of altering one or more dimensions of the support.

12. A method according to claim 11 comprising the step of forming the support from $Ni_3Si$.

* * * * *